(12) United States Patent
Sakai

(10) Patent No.: US 7,955,874 B2
(45) Date of Patent: *Jun. 7, 2011

(54) METHOD OF PRODUCING BONDED SILICON WAFER

(75) Inventor: Takashi Sakai, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/644,312

(22) Filed: Dec. 22, 2009

(65) Prior Publication Data

US 2010/0167425 A1    Jul. 1, 2010

(30) Foreign Application Priority Data

Dec. 25, 2008    (JP) .................... 2008-330993

(51) Int. Cl.
*H01L 21/66* (2006.01)
(52) U.S. Cl. .............. 438/5; 438/459; 257/E21.529
(58) Field of Classification Search .......... 438/5, 8, 438/455–465, 106, 107, 113
See application file for complete search history.

(56) References Cited

U.S. PATENT DOCUMENTS

| | | | | |
|---|---|---|---|---|
| 6,121,117 A | * | 9/2000 | Sato et al. | 438/459 |
| 6,566,233 B2 | * | 5/2003 | Yokokawa et al. | 438/455 |
| 7,718,509 B2 | * | 5/2010 | Endo et al. | 438/459 |
| 7,855,132 B2 | * | 12/2010 | Endo et al. | 438/522 |
| 2006/0014330 A1 | * | 1/2006 | Ichikawa et al. | 438/149 |
| 2007/0054466 A1 | * | 3/2007 | Hebras | 438/455 |
| 2007/0161199 A1 | * | 7/2007 | Morita | 438/311 |
| 2007/0194413 A1 | * | 8/2007 | Himi et al. | 257/635 |
| 2010/0003834 A1 | * | 1/2010 | Ang | 438/770 |

FOREIGN PATENT DOCUMENTS

| | | |
|---|---|---|
| JP | 09-116125 A | 5/1997 |
| JP | 2000-124092 A | 4/2000 |
| WO | 2005/074033 A1 | 8/2005 |

* cited by examiner

*Primary Examiner* — Savitri Mulpuri
(74) *Attorney, Agent, or Firm* — Christensen O'Connor Johnson Kindness PLLC

(57) ABSTRACT

A bonded silicon wafer is produced by a method comprising a step of implanting oxygen ions from one surface of a silicon wafer for active layer to form an oxygen ion implanted layer, a step of bonding the one surface of the silicon wafer for active layer to one surface of a silicon wafer for support layer and then conducting a heat treatment for strengthening the bonding to form a silicon wafer composite, a step of polishing a silicon portion at a side of the silicon wafer for active layer in the silicon wafer composite on a rotating platen having a polishing means and stopping the polishing at a time of detecting change of physical properties on the rotating platen resulting from the exposure of at least a part of the oxygen ion implanted layer and a step of removing the oxygen ion implanted layer.

8 Claims, 4 Drawing Sheets

METHOD OF PRODUCING BONDED SILICON WAFER

BACKGROUND OF THE INVENTION

1. Field of the Invention

This invention relates to a method of producing a bonded silicon wafer and more particularly to a method of producing a bonded silicon wafer in which an active layer is thinned by polishing with an oxygen ion implanted layer as a polishing stop layer and also a method of producing a bonded silicon wafer in which polishing stop in thinning is conducted with a high accuracy. In the invention, the term "polishing" includes both chemical polishing (etching) and mechanical polishing. Moreover, the production method of the invention is applicable to both SOI (Silicon On Insulator) wafers and DSB (Direct Silicon Bonding) wafers.

2. Description of the Related Art

The SOI wafer is superior in the isolation between devices, reduction of parasitic capacity between a device and a substrate and possibility of three-dimensional structure to the conventional silicon wafer. Therefore, it is used in LSI with high speed and low power consumption. As a method of producing an SOI wafer is known a bonding method in which two silicon wafers provided with an insulating layer (BOX layer) are bonded to each other and thereafter ground and polished to form an SOI layer (active layer). This bonding method includes a Smart Cut (Registered Trademark) method (JP-A-H09-116125 and JP-A-2000-124092).

Thinning and thickness uniformity of SOI layer (active layer) are desired in the SOI wafer. Thus, a new method has been developed. In this method, after a silicon wafer for active layer having an oxygen ion implanted layer is bonded to a silicon wafer for support layer, the oxygen ion implanted layer is changed to an $SiO_2$ layer by a heat treatment, and grinding and polishing are conducted from the side of silicon wafer for active layer to the $SiO_2$ layer, and thereafter the $SiO_2$ layer is removed to enable thinning and thickness uniformity of SOI layer (active layer) (WO 05/074033 A1). The oxygen ion implanted layer serves as a polishing stop layer.

Recently, the thickness of the insulating layer (BOX layer) is reduced with the miniaturization and lower power consumption of devices and further it is performed to develop DSB wafers by directly bonding a silicon wafer for active layer having no insulating layer (BOX layer). In case of direct bonding without an insulating film, after the general cleaning (SC1), a silicon wafer for active layer is bonded to a silicon wafer for support layer.

However, the production method of the bonded silicon wafer using the polishing stop layer as described in WO 05/074033 A1 has the following problems.

A part (silicon layer) of the wafer for active layer is polished by chemical polishing action with a caustic solution as a polishing solution. When etching is conducted with the caustic solution, the difference of etching rate between silicon and $SiO_2$ is large, but it is very difficult to judge whether the polishing reaches the oxygen ion implanted layer only by such a difference of etching rate. Thus, it is required that the polishing is stopped once to set a polishing time by measuring the thickness of the silicon wafer composite or calculating a polishing rate.

Moreover, as the polishing of the silicon layer proceeds, the oxygen ion implanted layer (layer including $SiO_2$) is at a partly exposed state. At this state, the layer including $SiO_2$, namely the oxygen ion implanted layer is polished by not only the chemical polishing action using the difference of etching rate between silicon and $SiO_2$ but also mechanical polishing action, so that the variation in the thickness of the active layer becomes large. In addition, there is a problem that the oxygen ion implanted layer in the silicon wafer for active layer is over-etched by the mechanical polishing action during polishing of a silicon wafer composite formed by bonding the silicon wafer for active layer to the silicon wafer for support layer.

SUMMARY OF THE INVENTION

It is, therefore, an object of the invention to advantageously solve the above problems and to provide a method of producing a bonded silicon wafer by thinning an active layer through polishing with an oxygen ion implanted layer as a polishing stop layer, wherein polishing stop in thinning is conducted with a high accuracy without breaking the polishing on the way for judging the timing of polishing stop to improve the variation in the thickness of the active layer in the bonded silicon wafer and the over-etching of the oxygen ion implanted layer in the silicon wafer for active layer is prevented.

In order to solve the above problems, the inventors have made various studies on a method of producing a bonded silicon wafer in which polishing stop can be conducted properly by polishing a silicon wafer composite formed by bonding a silicon wafer for active layer provided with an oxygen ion implanted layer to a silicon wafer for support layer from the side of silicon wafer for active layer under various conditions.

As a result, it has been found that the polishing stop can be conducted properly by polishing a silicon wafer composite from the side of silicon wafer for active layer on a rotating platen having a polishing means to expose at least a part of the oxygen ion implanted layer to thereby detect the change of physical properties on the rotating platen.

The invention is based on the above knowledge and the summary and construction thereof are as follows:

1. A method of producing a bonded silicon wafer comprising
a step of implanting oxygen ions from one surface of a silicon wafer for active layer to form an oxygen ion implanted layer at a given depth area from the one surface of the silicon wafer for active layer;
a step of bonding the one surface of the silicon wafer for active layer to one surface of a silicon wafer for support layer with or without an insulating layer and then conducting a heat treatment for strengthening the bonding to form a silicon wafer composite;
a step of polishing a silicon portion at a side of the silicon wafer for active layer in the silicon wafer composite on a rotating platen having a polishing means and stopping the polishing at a time of detecting change of physical properties on the rotating platen resulting from the exposure of at least a part of the oxygen ion implanted layer; and
a step of removing the oxygen ion implanted layer.

2. The method according to the item 1, wherein the change of physical properties is a change of friction resistance produced between the polishing means and a polished surface of the silicon wafer composite.

3. The method according to the item 2, wherein the friction resistance is measured by a rotation torque applied to the rotating platen.

4. The method according to the item 1, wherein the silicon wafer composite is polished by making rotation number of the rotating platen different before and after the polishing stop.

5. The method according to the item 1, wherein the polishing means comprises a polishing cloth substantially containing no abrasives and a polishing solution containing abrasives.

6. The method according to the item 1, wherein the polishing means comprises a polishing cloth fixed with given abrasives and a polishing solution substantially containing no abrasives.

7. The method according to the item 5, wherein the polishing solution is a solution containing abrasives and has a different abrasive concentration before and after the polishing stop for polishing the silicon wafer composite.

8. The method according to the item 1, wherein an amount of the silicon wafer composite polished is 0.1 to 50 µm in total before and after the polishing stop.

9. The method according to the item 5 or 6, wherein the polishing cloth is a urethane or a urethane-containing nonwoven cloth, and the polishing solution is a caustic solution.

10. The method according to the item 1, wherein the bonded silicon wafer is composed of a silicon single crystal or of a silicon single crystal and a silicon oxide.

According to the invention, the oxygen ion implanted layer is formed in the silicon wafer for active layer and thereafter the silicon wafer for active layer is bonded to the silicon wafer for support layer to form the silicon wafer composite and then a silicon portion of the silicon wafer composite at a side of the silicon wafer for active layer is polished on the rotating platen having a polishing means, and the polishing is stopped at a time of detecting the change of physical properties on the rotating platen based on the fact that at least a part of the oxygen ion implanted layer is exposed, whereby the bonded silicon wafer having a small variation in the thickness of the active layer can be obtained without breaking the polishing for judging the timing of polishing stop, and the over-etching of the oxygen ion implanted layer in the silicon wafer for active layer can be prevented.

According to the invention, the polishing stop can be conducted by detecting the change of friction resistance produced between the polishing means and the polishing surface of the silicon wafer composite on the rotating platen.

According to the invention, the friction resistance produced between the polishing means and the polishing surface of the silicon wafer composite can be measured by a rotation torque applied to the rotating platen.

DESCRIPTION OF THE PREFERRED EMBODIMENTS

Figure 1:
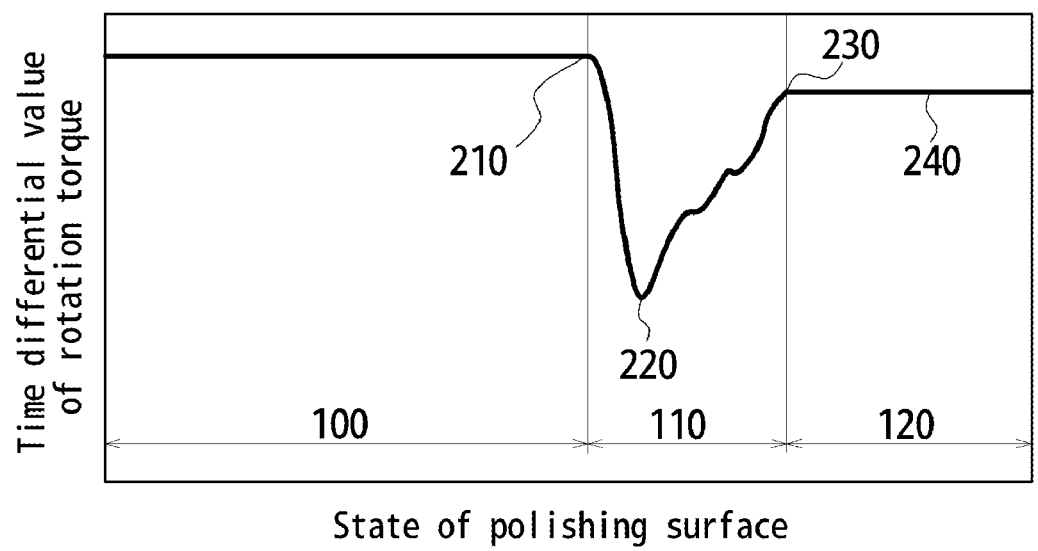
FIG. 1 is a graph showing a relation between a state of a polishing surface of a silicon wafer composite and a change of rotation torque applied to a rotating platen.

As long as the silicon wafer for active layer and the silicon wafer for support layer have a good surface roughness suitable for bonding, a kind and a concentration of a dopant, a concentration of oxygen and the like are not limited. In order to further reduce defects, however, it is preferable to use a silicon wafer having no COP or less COP. For the reduction of COP may be applied a method of reducing COP by optimizing CZ drawing conditions, a method of subjecting a wafer to a high-temperature heat treatment at not lower than 1000° C. in a reducing atmosphere after mirror working, a method of epitaxial-growing silicon on a silicon wafer by CVD or the like, and so on.

The crystal face of the silicon wafer for active layer is generally (100) face or (110) face. However, it is not limited thereto and (111) face may be the crystal face of the silicon wafer for active layer. Also, the same is applied to the crystal face of the silicon wafer for support layer, and the combination with the crystal face of the silicon wafer for active layer is not particularly limited.

The method of producing a bonded silicon wafer of the invention using the above silicon wafer for active layer and the silicon wafer for support layer comprises the following steps of (1) to (4):

(1) Step of implanting oxygen ions from one surface of the silicon wafer for active layer to form an oxygen ion implanted layer at a given depth area from the one surface of the silicon wafer for active layer;

(2) Step of bonding the one surface of the silicon wafer for active layer to one surface of the silicon wafer for support layer with or without an insulating layer and then conducting a heat treatment for strengthening the bonding to form a silicon wafer composite;

(3) Step of polishing a silicon portion at a side of the silicon wafer for active layer in the silicon wafer composite on a rotating platen having a polishing means and stopping the polishing at a time of detecting change of physical properties on the rotating platen resulting from the exposure of at least a part of the oxygen ion implanted layer; and (4) Step of removing the oxygen ion implanted layer.

Next, the above each step will be explained.

(1) Step of Forming an Oxygen Ion Implanted Layer

Oxygen ions are implanted from one surface of the silicon wafer for active layer by a well-known method to form an oxygen ion implanted layer at a given depth area from the one surface of the silicon wafer for active layer. The given depth area can be properly selected depending on a thickness of an active layer in a bonded silicon wafer as a final product and is not particularly limited. Also, the given depth area forming the oxygen ion implanted layer is determined by an acceleration voltage of an oxygen ion implanting apparatus, and the implantation may be typically conducted in a range of 150 to 220 keV.

When the dose in the oxygen ion implantation is less than $2\times10^{16}$ atoms/cm$^2$, there is a problem that the change of physical properties during polishing cannot be detected, while when it exceeds $2\times10^{17}$ atoms/cm$^2$, the change of physical properties can be detected sufficiently, but there is a risk that a time required for oxygen ion implantation is increased to lower the productivity. Therefore, the dose in the oxygen ion implantation is preferable to be a range of $2\times10^{16}$ to $2\times10^{17}$ atoms/cm$^2$. Moreover, the oxygen ion implantation may be conducted in several batches by changing the energy, dose and wafer temperature for forming a stronger stop layer.

(2) Step of Forming a Silicon Wafer Composite

The one surface of the silicon wafer for active layer is bonded to one surface of the silicon wafer for support layer with or without an insulating layer and then subjected to a heat treatment for strengthening the bonding to form a silicon wafer composite. The silicon wafer composite formed by indirectly bonding the silicon wafer for active layer to the silicon wafer for support layer with the insulating layer is subjected to subsequent steps to form an SOI wafer. The silicon wafer composite formed by directly bonding the silicon wafer for active layer to the silicon wafer for support layer without the insulating layer is subjected to subsequent steps to form a DSB wafer. That is, the SOI wafer is composed of a silicon single crystal and a silicon oxide, and the DSB wafer is composed of a silicon single crystal.

As the insulating layer is preferable an oxide layer ($SiO_2$), a nitride layer ($Si_3N_4$) or the like. As the method of forming the insulating layer are preferable a heat treatment in an oxidizing atmosphere or a nitrogen atmosphere (thermal oxidation, thermal nitriding), CVD and so on. As the thermal oxidation may be used a wet oxidation using steam in addition to the use of oxygen gas. Moreover, the formation of the insulating layer may be conducted before oxygen ions are implanted into the silicon wafer for active layer.

As an atmosphere in the bonding is preferable a non-oxidizing atmosphere and particularly argon atmosphere, hydrogen atmosphere or a mixed atmosphere thereof is advantageously suitable. The bonding temperature is preferable to be not higher than 1000° C. In case of bonding at not higher than 1000° C., the bonded strength is not sufficient and there is a risk that debonding is caused according to conditions (pressure, speed) at grinding and polishing steps after the bonding. Therefore, it is preferable that the silicon surface before the bonding is subjected to an activation treatment with plasma using oxygen, nitrogen, helium, hydrogen, argon or a mixed atmosphere thereof to enhance the bonded strength.

Before the bonding, it is preferable to conduct a cleaning treatment for suppressing the occurrence of voids due to particles. As the cleaning method is effective a general method for cleaning silicon wafers with SC1+SC2, HF+$O_3$, an organic acid, or a combination thereof.

In case of direct bonding without the insulating layer, $H_2O$ adsorbed on the bonding surfaces is changed into $SiO_2$ through the subsequent heat treatment and is existent in a bonded interface, so that the formation of $SiO_2$ may be suppressed by cleaning the bonding surfaces with HF and then bonding their hydrophobic faces with each other. Thus, the oxide can be reduced at the bonded interface to bring about the improvement of device properties.

The heat treatment for strengthening the bonded strength is preferably conducted at a temperature of 1000 to 1200° C. for 1 to 10 hours for sufficiently improving the bonded strength. The atmosphere is not particularly limited, but an oxidizing atmosphere is preferable because the silicon wafer after the bonding is covered with an oxide film having a thickness of not less than 5000 nm for protecting a back surface of the silicon wafer at the subsequent polishing step.

(3) Polishing Step

A silicon portion of the silicon wafer composite at a side of the silicon wafer for active layer is polished on a rotating platen having a polishing means and the polishing is stopped at a time of detecting the change of physical properties on the rotating platen based on the exposure of at least a part of the oxygen ion implanted layer.

As the rotating platen can be used various polishing apparatuses having a polishing means, but it is preferable to use a single wafer type polishing apparatus capable of polishing silicon wafer composites one by one. Because, the amount, form and distribution of $SiO_2$ in the oxygen ion implanted layer largely exerting on the detection of polishing stop are scattered every silicon wafer for active layer implanted with oxygen ions even when the conditions for implanting oxygen ions are strictly controlled, and the position of exposing at least a part of the oxygen ion implanted layer differs every the silicon wafer composite due to such a scattering, but when silicon wafer composites are polished one by one, the exposure of at least a part of the oxygen ion implanted layer can be detected based on the change of physical properties on the rotating platen for each silicon wafer composite separately, whereby the polishing can be stopped optimally.

The polishing step is preferably conducted at the following three stages. Each stage will be described separately.

First Polishing Stage

In the first polishing stage, the silicon wafer composite is polished from the surface at the side of the silicon wafer for active layer in the silicon wafer composite, and the polishing is finished at a surface parallel to the oxygen ion implanted layer and separated by a distance L from the oxygen ion implanted layer toward the surface side of the silicon wafer for active layer.

The distance L is preferable to be a range of 1.0 to 4.0 μm. When the distance L is less than 1.0 μm, the positional accuracy in flatness control exceeds upper-bound error, and hence the polishing reaches the oxygen ion implanted layer in the first polishing stage, resulting in the occurrence of poor thickness of active layer in the bonded silicon wafer as a final product. While, when the distance L exceeds 4.0 μm, a polishing margin in the subsequent second polishing stage increases, and hence a polishing time in the second polishing stage is prolonged to lower the productivity. Therefore, the distance L is preferably a range of 1.0 to 4.0 μm, more preferably a range of 2.0 to 3.0 μm.

In the first polishing stage, an oxide film existing on the polishing surface of the silicon wafer composite is removed, and thereafter the form is corrected to render into a form optimal for the second polishing stage. As a concrete method is a flatness control in which the polishing is conducted while monitoring a pressure applied to the wafer, a pressure applied by a retainer and the like.

Second Polishing Stage

In the second polishing stage, the silicon wafer composite after the end of the first polishing stage is polished from the first-stage polished surface, and the polishing is finished at a time of exposing at least a part of the oxygen ion implanted layer on the polished surface. Until at least a part of the oxygen ion implanted layer is exposed on the polished surface during the second polishing stage, a silicon layer in the silicon wafer for active layer is polished by chemical polishing action. In this case, the silicon layer in the silicon wafer for active layer can be polished efficiently depending on the difference of etching rate between silicon and $SiO_2$ in a polishing solution, but the polishing efficiency of $SiO_2$ in the oxygen ion implanted layer becomes deteriorated. That is, according to the invention, the deterioration of the polishing efficiency based on the change from the state of polishing only silicon to the exposure of at least a part of the oxygen ion implanted layer is detected as a change of physical properties on the rotating platen having a polishing means.

At this moment, when the entire oxygen ion implanted layer is made of complete $SiO_2$ and the polishing efficiency is zero or no polishing is conducted, this oxygen ion implanted layer serves as a complete polishing stop layer. However, since there is a scattering in the amount, form and distribution of $SiO_2$ in the oxygen ion implanted layer, both $SiO_2$ and silicon are actually and often existent in the oxygen ion implanted layer, and also $SiO_2$ may be dissolved in a polishing solution depending on the kind of the polishing solution, resulting in the deterioration of polishing stop function. In the invention, however, even when at least a part of the oxygen ion implanted layer is exposed and a small amount of $SiO_2$ is polished, the change of physical properties is detected on the rotating platen, so that even when the oxygen ion implanted layer is not a complete polishing stop layer, the exposure of at least a part of the oxygen ion implanted layer can be surely detected.

It is presumable that the exposure of at least a part of the oxygen ion implanted layer is detected by utilizing the difference of color between silicon and $SiO_2$ to shoot a fact that the color of $SiO_2$ starts to come on the whole polishing surface being the color of silicon with a CCD camera or the like when at least a part of the oxygen ion implanted layer is exposed on the polishing surface and then processing the shot image with an image processing apparatus or the like. However, the polishing surface contacts with a polishing means during the polishing, so that it is difficult to shoot the entire polishing surface of the silicon wafer composite during polishing with a CCD camera or the like. In the invention, therefore, the change of physical properties is detected on the rotating platen with a polishing means polishing the silicon wafer composite.

The change of physical properties is preferable to be a change of friction resistance produced between the polishing means and the polishing surface of the silicon wafer composite. Because, as the polishing proceeds from the polishing of the silicon layer substantially made of only silicon in the silicon wafer for active layer, when at least a part of the oxygen ion implanted layer is exposed and even a small amount of $SiO_2$ comes on the polishing surface, the friction resistance produced between the polishing means and the polishing surface of the silicon wafer composite is changed due to the difference of etching rate between silicon and $SiO_2$. Moreover, the term "substantially made of only silicon" means that the silicon layer can include a slight amount of elements added as a dopant and inevitable impurities.

Moreover, the friction resistance is preferably measured by a rotation torque applied to the rotating platen. Means for measuring the rotation torque applied to the rotating platen differs depending on the kind of a rotation driving means for the rotating platen, but is a current value of a motor, a torsion value of a rotating axis of the rotating platen, a vibration value of the rotating platen or the like. However, it is particularly preferable that when the rotation driving means for the rotating platen is an electric motor, the electric motor measures a current value of the rotating motor to determine the rotation torque. This is due to the fact that a slight change of the rotation torque can be measured with a high accuracy.

In FIG. 1 is shown an example of a graph illustrating a relation between a change of rotation torque and a state of a polishing surface of a silicon wafer composite by measuring a current value of a rotating motor with the electric motor to determine a rotation torque applied to the rotating platen polishing the silicon wafer composite.

Figure 2:
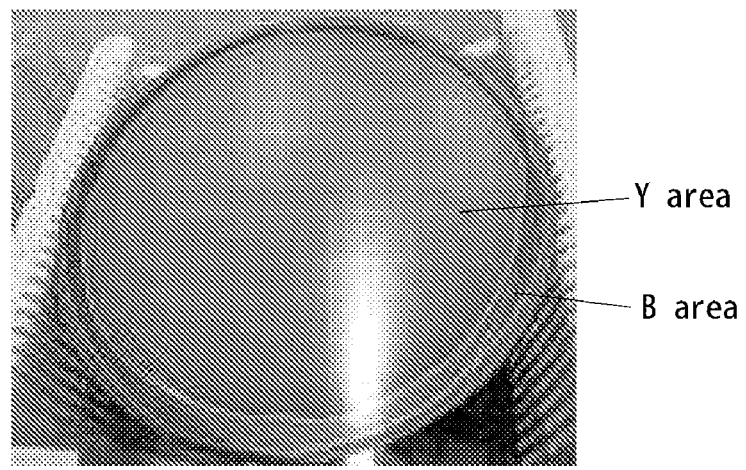
FIG. 2 is a photograph showing a state of a polishing surface of a silicon wafer composite at a time of starting a change of rotating torque.
Figure 3:
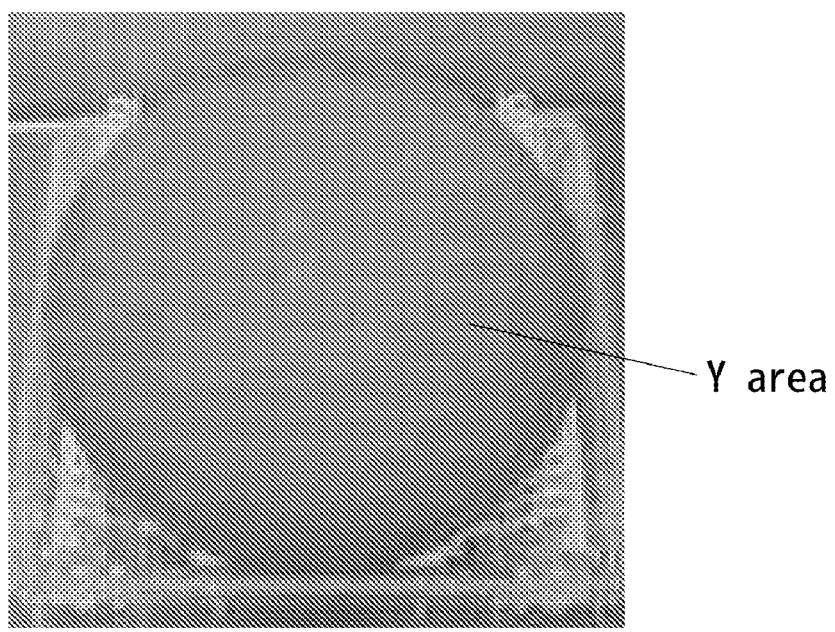
FIG. 3 is a photograph showing a state of a polishing surface of a silicon wafer composite at a minimum rotating torque.
Figure 4:
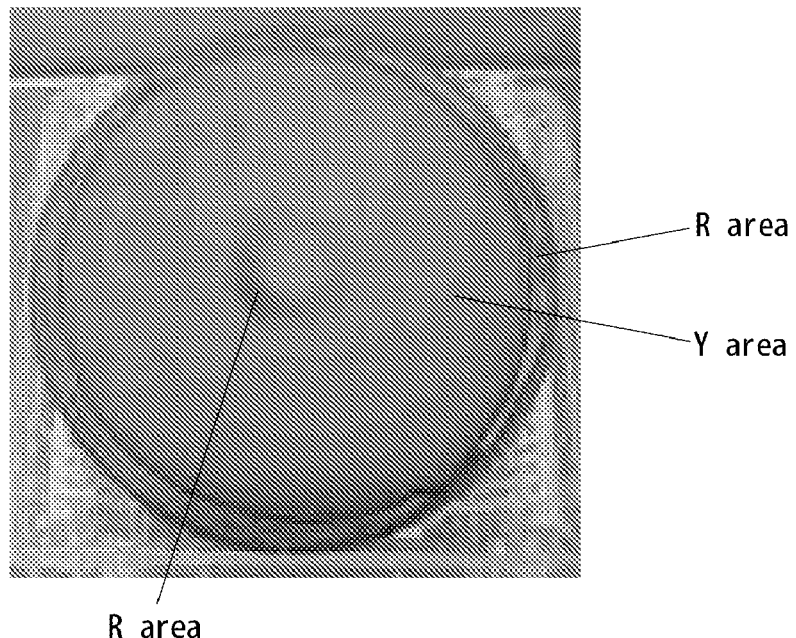
FIG. 4 is a photograph showing a state of a polishing surface of a silicon wafer composite at a time of terminating a change of rotating torque.
Figure 5:
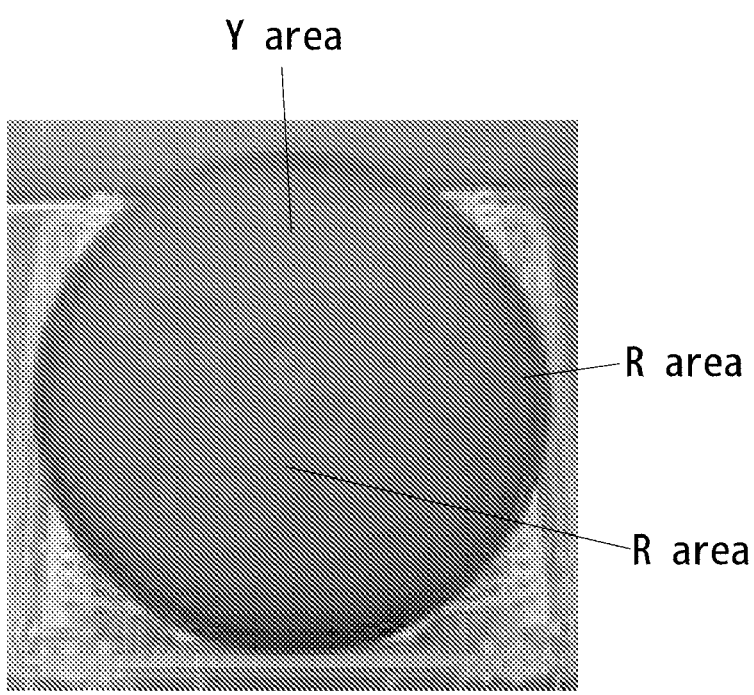
FIG. 5 is a photograph showing a state of a polishing surface of a silicon wafer composite at a time of stable rotating torque.

In FIG. 1, a vertical axis shows a time differential value of the rotation torque applied to the rotating platen converted from the motor current value, and a horizontal axis shows a state of a polishing surface of the silicon wafer composite changing with the progression of the polishing of the silicon wafer composite. Concretely, there are shown, from the left side of the horizontal axis, a state 100 where the entire polishing surface is a silicon layer, a state 110 where at least a part of the oxygen ion implanted layer is exposed on the polishing surface, and a state 120 where the exposure of the oxygen ion implanted layer is maintained over the entire polishing surface. The bold line in FIG. 1 shows a change of rotation torque applied to the rotating platen during the polishing of the silicon wafer composite. In FIG. 1 are also shown a point 210 of starting the change of rotation torque, a point 220 of minimizing rotation torque, a point 230 of terminating the change of rotation torque, and a point 240 of stable rotation torque. In each point, the rotating platen is stopped once and the state of the polishing surface of the silicon wafer composite is visually observed to obtain results as shown in FIGS. 2 to 5. That is, FIG. 2 shows a state of the polishing surface of the silicon wafer composite at the point 210 of starting the change of rotation torque; FIG. 3 shows a state of the polishing surface of the silicon wafer composite at the point 220 of minimizing rotation torque; FIG. 4 shows a state of the polishing surface of the silicon wafer composite at the point 230 of terminating the change of rotation torque; and FIG. 5 shows a state of the polishing surface of the silicon wafer composite at the point 240 of stable rotation torque. In FIGS. 2 to 5, a Y area (yellow area) is an oxygen ion implanted layer and a B area (blue area) is a silicon layer. Moreover, an R area (red area) is a portion of the oxygen ion implanted layer thinned by polishing.

As seen from FIG. 2, at the point 210 of starting the change of rotation torque being a transfer point from the state 100 where the entire polishing surface is a silicon layer to the state 110 where at least a part of the oxygen ion implanted layer is exposed on the polishing surface are mixedly existent the silicon layer of the B area (blue area) and the oxygen ion implanted layer of the Y area (yellow area) at a state of exposing at least a part of the oxygen ion implanted layer. Thus, when polishing is stopped at a time of detecting the change of rotation torque applied to the rotating platen or detecting the change of physical properties on the rotating platen, the polishing surface is at a state of exposing at least a part of the oxygen ion implanted layer. As shown in FIG. 3, most of the polishing surface becomes the oxygen ion implanted layer of the Y area (yellow area) with the progression of the polishing. With further progression of the polishing, as shown in FIG. 4, the oxygen ion implanted layer of the Y area (yellow area) is mixedly existent with a portion of the oxygen ion implanted layer of the R area thinned by polishing, but the proportion of the oxygen ion implanted layer of the Y area (yellow area) becomes larger. Then, when the polishing further proceeds, the portion of the oxygen ion implanted layer of the R area (red area) thinned by polishing becomes larger as shown in FIG. 5.

In the state 100 where the entire polished surface is a silicon layer as shown in FIG. 1, only silicon is substantially polished and thus rotation torque is stable at a constant value. When such a state is changed to the state 110 where at least a part of the oxygen ion implanted layer is exposed on the polishing surface, the rotation torque starts to lower from the point 210 of starting the change of rotation torque, and the lowering of the rotation torque is continued up to the point 220 of minimizing the rotation torque, and thereafter the rotation torque again starts to increase and becomes stable again at the point 230 of terminating the change of rotation torque where the state changes to the state 120 where the oxygen ion implanted layer is maintained over the entire polishing surface. At this moment, the reason why the rotation torque starts to lower from the point 210 of starting the change of rotation torque is considered due to the fact that the friction coefficient of the oxygen ion implanted layer on the rotating platen is smaller then that of the silicon layer on the rotating platen and the proportion of the oxygen ion implanted layer on the polishing surface increases as the polishing proceeds. On the other hand, the reason why the rotation torque is changed from decrease to increase at the point 220 of minimizing rotation torque minimal is assumed due to the fact that the thickness of the oxygen ion implanted layer is thinned with the progression of the polishing to make the distance between the surface of the oxygen ion implanted layer as a polishing surface and the silicon layer existent just beneath the oxygen ion implanted layer short and the silicon layer having a large friction coefficient to the rotating platen as compared with the oxygen ion implanted layer is affected even in the polishing of the surface of the oxygen ion implanted layer. Moreover, the rotation torque at the state 120 where the oxygen ion implanted layer is maintained over the entire polishing surface is lower than that at the state 100 where the entire polishing surface is the silicon layer. This is assumed due to the fact that the friction coefficient of the oxygen ion implanted layer on the rotating platen is smaller than that of the silicon layer on the rotating platen.

The point 240 of stable rotation torque is a point where the polishing is continued for 5 minutes from the point 230 of terminating the change of rotation torque, wherein the exposure of the oxygen ion implanted layer is maintained over the entire polishing surface as shown in FIG. 5. When the polishing further proceeds from the point 240 of stable rotation torque, mechanical polishing action starts to work, whereby the vicinity of an outer peripheral edge of the oxygen ion implanted layer is polished to expose the silicon layer existing beneath the oxygen ion implanted layer in a ring form on an outer peripheral portion of the silicon wafer composite. The width of this ring is called a terrace width and is preferable to be not more than 3 mm. In the invention, the timing of polishing stop is judged before the terrace width of the polished product is substantially increased. That is, the timing around the point 230 of stable rotation torque may be judged to be the timing of polishing stop. Moreover, the terrace width at the point 230 of stable rotation torque is 1 mm.

Third Polishing Stage

The silicon wafer composite having at least an exposed part of the oxygen ion implanted layer after the completion of the second polishing stage is subjected to the third polishing stage for removing all silicon left on the oxygen ion implanted layer. When the polishing margin at the third polishing stage is less than 0.1 μm all silicon left on the oxygen ion implanted layer cannot be removed and hence the surface roughness of the active layer after the removal of the oxygen ion implanted layer is deteriorated. While, when the polishing margin at the third polishing stage exceeds 1 μm, the oxygen ion implanted layer is also polished and hence the surface roughness of the active layer after the removal of the oxygen ion implanted layer is deteriorated. Therefore, the polishing margin at the third polishing stage is preferable to be a range of 0.1 to 1 μm.

Next, the polishing means provided on the rotating platen will be described. The polishing means may comprise a polishing cloth substantially containing no abrasives and a polishing solution containing abrasives. Here, the expression "substantially containing no abrasives" means that abrasives are not purposely fixed on the polishing cloth and does not mean that abrasives inevitably attached onto the polishing cloth are also removed.

It is preferable that the polishing cloth and the polishing solution are used separately according to each of the above polishing stages.

First Polishing Stage

The polishing cloth is preferable to be of urethane or a hard nonwoven cloth impregnated with urethane. The polishing solution is preferable to be formed by including abrasives such as colloidal silica or the like within a range of 1 to 30 mass % into an inorganic caustic solution capable of advantageously removing an organic film or an oxide film on the surface of the silicon wafer composite in the polishing start such as KOH, NaOH or the like.

Second Polishing Stage

The polishing cloth is preferable to be of urethane or a nonwoven cloth impregnated with urethane, which is equal to or softer than that used in the first polishing stage. The polishing solution is preferable to be an organic caustic composed mainly of an amine such as piperazine, ethylenediamine or the like including not more than 1 mass % of abrasives such as colloidal silica. When the combination of such polishing cloth and polishing solution is used as the polishing means, the change of physical properties on the rotating platen can be advantageously detected. Particularly, this combination is advantageous when the change of friction resistance produced between the polishing means and the polishing surface of the silicon wafer composite is detected as a change of rotation torque applied to the rotating platen.

Third Polishing Stage

The polishing cloth is of urethane or a nonwoven cloth impregnated with urethane, which can be widely used from a hard cloth equal to that used in the first polishing stage to a soft cloth of suede form. The polishing solution is preferable to be an organic caustic composed mainly of an amine such as piperazine, ethylenediamine or the like including 0.3-1 mass % of abrasives such as colloidal silica.

Next, the abrasive concentration in the polishing solution will be described. The abrasive concentration in the polishing solution can be made different before and after the polishing stop. That is, the abrasive concentration can be made different between the second polishing stage and the third polishing stage. In this case, it is preferable that the abrasive content in the second polishing stage is not more than 1 mass % and the abrasive content in the third polishing stage is a range of 0.3 to 1 mass %.

Also, the polishing means may comprise a polishing cloth fixed with given abrasives and a polishing solution substantially containing no abrasives. In this case, it is preferable that the polishing cloth is an urethane polishing cloth fixed with colloidal silica as abrasives and the polishing solution is a caustic solution. Here, the expression "substantially containing no abrasives" means that abrasives are not purposely included in the polishing solution, and abrasives inevitably included may not be excluded.

Next, the revolution number of the rotating platen having the polishing means during the polishing will be described. When the exposure of a part of the oxygen ion implanted layer is detected as a change of physical properties on the rotating platen, if the revolution number of the rotating platen in the second polishing stage is less than 2 rpm, there is a problem that noise is likely to be incorporated into a measured value of rotation torque when the rotation torque is calculated as a time differential value, while if it exceeds 100 rpm, there is a problem in the accuracy at the timing of polishing stop after the detection of rotation torque for stopping the polishing. Therefore, the revolution number of the rotating platen in the second polishing stage is preferable to be a range of 2 to 100 rpm.

The revolution number of the rotating platen may be made different before and after the polishing stop, that is, between the second polishing stage and the third polishing stage. In this case, it is preferable that the revolution number of the rotating platen in the third polishing stage is faster by a range of 1 to 30 rpm than that in the second polishing stage. This is due to the fact that since the proportion of the oxygen ion implanted layer having a small friction coefficient on the rotating platen as compared with the silicon layer is increased on the polishing surface, the polishing speed can be increased to shorten the polishing time.

As mentioned above, the polishing is preferably conducted at three stages. However, either the first polishing stage or the third polishing stage or both of them may be included in the second polishing stage. Moreover, the polishing amount of the silicon wafer composite is preferable to be a range of 0.1 to 50 μm in total before and after the polishing stop. When the polishing amount is less than 0.1 there is a problem that the stable area of rotation torque is small and an error of detecting termination point is caused, while when it exceeds 50 μm, there is a problem that an error of detecting termination point is caused due to the deterioration of the flatness in the polished surface.

(4) Step of Removing Oxygen Ion Implanted Layer.

The removal of the exposed oxygen ion implanted layer can be conducted, for example, by a treatment with HF solution. The HF solution treatment is conducted by using, for example, a batch type cleaning apparatus and immersing the silicon wafer composite with exposed oxygen ion implanted layer in an HF solution diluted to 1 mass % for 5 minutes, whereby the exposed oxygen ion implanted layer can be completely removed. When $SiO_2$ in the oxygen ion implanted layer has a discontinuous form, a heat treatment in an oxidizing atmosphere is conducted to change the discontinuous form of $SiO_2$ into a continuous $SiO_2$ layer and thereafter the HF treatment can be conducted to completely remove $SiO_2$.

Although the above is described on main steps in the invention, the following steps can be added, if necessary.

Grinding Step

Before the first polishing stage, the silicon wafer composite may be subjected to mechanical grinding. The mechanical grinding is conducted from the surface of the silicon wafer for active layer in the silicon wafer composite, and then terminated so as to leave the silicon portion existing on the surface side of the silicon wafer for active layer rather than the oxygen ion implanted layer. The thickness of the silicon portion left at the surface side of the silicon wafer for active layer rather than the side of the oxygen ion implanted layer (thickness of residual silicon film) is preferable to be as thin as possible for shortening the time of polishing followed by the grinding. Considering the precision of the grinding apparatus and the damage depth through the grinding (about 2 μm), the thickness of residual silicon film is preferable to be a range of 3 to 50 μm.

Pretreatment Step of Terrace Portion

When the silicon wafer composite is etched before polishing, a boundary between a terrace (an outer peripheral region of 1 to 3 mm not bonding two wafers to each other) and a bonded region becomes smooth to suppress the occurrence of particles. Moreover, only the terrace portion may be polished before the polishing process.

Pre-Annealing Step

In order to render the oxygen ion implanted layer into a more complete polishing stop layer, it is preferable that the silicon wafer for active layer after the oxygen ion implantation is subjected to a pre-annealing to render silicon oxide of incomplete $SiO_2$ existing in the oxygen ion implanted layer into complete $SiO_2$. Although the pre-annealing has been conventionally conducted at a higher temperature of 1200° C. for making the amount of complete $SiO_2$ large, according to the invention, the exposure of at least a part of the oxygen ion implanted layer can be detected as the change of physical properties on the rotating platen during polishing even when the amount of the complete $SiO_2$ is small in the oxygen ion implanted layer, so that the temperature for pre-annealing can be made low, and also the pre-annealing can be omitted as long as the amount of complete $SiO_2$ in the oxygen ion implanted layer is obtained above a certain level only by the oxygen ion implantation. In case of the pre-annealing, when the pre-annealing temperature is lower than 1000° C., significantly long time is required in the treatment for rendering incomplete $SiO_2$ in the oxygen ion implanted layer into complete $SiO_2$, which is not practical. While, when it exceeds 1200° C., there is a risk that slipping occurs in the wafer. Therefore, the pre-annealing temperature is preferably a range of 1000 to 1200° C., more preferably a range of 1150 to 1200° C. When the pre-annealing time is less than 1 hour, incomplete $SiO_2$ in the oxygen ion implanted layer cannot be rendered into complete $SiO_2$, while when it exceeds 16 hours, the productivity is significantly deteriorated. Therefore, the pre-annealing time is preferable to be a range of 1 to 16 hours. Moreover, the thickness of the oxygen ion implanted layer obtained after the pre-annealing is within a range of 50 to 200 μm.

When the pre-annealing is conducted before the silicon wafer for active layer subjected to the oxygen ion implantation is bonded to the silicon wafer for support layer, it is preferable to conduct the pre-annealing in an inert gas atmosphere such as argon gas or the like or an oxidizing gas atmosphere for SOI wafers, and in an inert gas atmosphere such as argon gas or the like for DSB wafers.

Also, the pre-annealing may serve concurrently a heat treatment for reinforcing the bonding strength. In the conventional technique, the temperature for pre-annealing is required to be high and hence the pre-annealing is difficult to serve the heat treatment for strengthening the bonding. According to the invention, since the temperature for pre-annealing may be low, the pre-annealing can serve concurrently the heat treatment for strengthening the bonding. Moreover, when the pre-annealing serves concurrently the heat treatment for strengthening the bonding, it is preferable that the heat treating temperature is a range of 1000 to 1200° C. and the heat treating time is a range of 1 to 10 hours and the atmosphere for heat treatment is an oxidizing atmosphere. When the pre-annealing serves concurrently the heat treatment for strengthening the bonding in case of SOI wafers, it is preferable that the silicon wafer for active layer subjected to the oxygen ion implantation is subjected to a heat treatment at 950° C. in an oxidizing atmosphere for 1 hour before the bonding to the wafer for support layer, whereby an insulating layer (BOX layer) is formed on the surface of the silicon wafer for active layer.

Planarizing Step

A planarizing step for improving the flatness of a bonded silicon wafer as a final product may be added by polishing the surface of the silicon wafer composite after the removal of the oxygen ion implanted layer or by subjecting it to a heat treatment in a reducing atmosphere.

In case of the surface planarization by polishing, as the polishing margin is increased, the flatness is improved, but it depends on the accuracy of a polishing apparatus, so that it is common that the effect of the surface planarization by polishing is not so high as compared with planarization by heat treatment. Therefore, in order to obtain in-plane thickness uniformity in active layer, the polishing margin is preferable to be less than 0.1 μm. In case of the surface planarization by heat treatment, it is preferable that the heat treating temperature is a temperature sufficient to migrate silicon atoms so as to planarize the silicon wafer composite; i.e., a temperature of not lower than 1000° C. On the other hand, when the temperature exceeds 1200° C., a special heat-treating furnace is required and slip dislocation is easily caused by thermal stress. Therefore, the heat treating temperature is preferable to be a range of 1000 to 1200° C. The heat treating time may be a time sufficient to migrate silicon atoms so as to planarize the silicon wafer composite, and is a range of 10 minutes to 10 hours.

Although the above is described with respect to only one embodiment of the invention, various modifications may be made without departing from the scope of the appended claims.

EXAMPLE

The invention will be further described with reference to examples.

At first, each sample is produced according to the following procedures.

Invention Example 1

(a) There are prepared two silicon wafers having a substrate resistance of 1 to 20 Ωcm and a diameter of 300 mm sliced from a p-type silicon ingot with a crystal surface of (110), one of which is used as a silicon wafer for active layer and the other is used as a silicon wafer for support layer.

(b) An oxygen ion implanted layer is formed by implanting oxygen ions from one surface of the wafer for active layer. The oxygen ion implantation is conducted at two stages, and implantation conditions for each stage are as follows.
First Stage
Acceleration voltage: 200 keV, dose: $1\times10^{17}$ atoms/cm$^2$, silicon wafer temperature: 400° C.
Second Stage
Acceleration voltage: 200 keV, dose: $4\times10^{15}$ atoms/cm$^2$, silicon wafer temperature: 30° C.

(c) The silicon wafer for active layer subjected to the oxygen ion implantation is subjected to pre-annealing at 1100° C. in an argon atmosphere for 12 hours. Furthermore, the silicon wafer for active layer after the pre-annealing is subjected to a heat treatment at 950° C. in a steam atmosphere for 4 hours to form an insulating layer (BOX layer) having a thickness of 150 nm.

(d) The one surface of the silicon wafer for active layer provided with the insulating layer (oxygen ion implantation side) is bonded to a surface of the silicon wafer for support layer, and a heat treatment is conducted at 1100° C. in a steam atmosphere for 2 hours to strengthen the bonding to thereby form a silicon wafer composite having an oxide film with a thickness of 400 nm (per one side) on both surfaces thereof. Before bonding, each of the silicon wafers is cleaned with SC-1.

(e) The silicon wafer composite is ground from the surface of the silicon wafer for active layer with a grinding stone of #300, whereby a thickness of silicon portion existing at the surface side of the silicon wafer for active layer rather than the side of the oxygen ion implanted layer is made to about 10 μm.

(f) The silicon wafer composite after the completion of terrace portion pre-treatment is polished with the use of a single wafer type polishing apparatus having a rotating platen with a polishing means under the following conditions. Moreover, the polishing stop is conducted by detecting the change of physical properties on the rotation platen according to the invention.

Driving means for rotating platen: electric motor
Physical property: friction resistance between a polishing means and a polishing surface of the silicon wafer composite
Means for measuring physical property: rotation torque applied to the rotating platen is measured as a motor current value of the electric motor during rotation
Revolution number of rotating platen: 31 rpm
Polishing cloth: urethane polishing cloth containing no abrasive
Polishing solution: caustic solution containing abrasives of less than 1 mass % (not including 0)

(g) The silicon wafer composite after the completion of the polishing is caustic-etched by 3 μm in thickness by immersing in a KOH solution to remove process damages.

(h) The silicon wafer composite after the removal of process damages is subjected to a heat treatment at 1000° C. in an oxygen atmosphere for 1 hour and then immersed in a solution of 20 mass % of HF for 10 minutes, whereby the exposed oxygen ion implanted layer is removed to obtain a bonded silicon wafer.

Comparative Example 1

A sample is prepared in the same way as in Invention Example 1 except that polishing stop is conducted based on polishing time calculated from polishing rate in the polishing of the silicon wafer composite in the above step (f).

Invention Example 2

A sample is prepared in the same way as in Invention Example 1 except that the revolution number of the rotating platen is made different before and after polishing stop. The revolution number before polishing stop is 31 rpm, and the revolution number after polishing stop is 51 rpm.

Invention Example 3

A sample is prepared in the same way as in Invention Example 1 except that colloidal silica is fixed as abrasives on a polishing cloth and a caustic solution substantially containing no abrasive is used as a polishing solution.

Invention Example 4

A sample is prepared in the same way as in Invention Example 1 except that the abrasive concentration is made different before and after polishing stop. The abrasive concentration before polishing stop is 0.5 mass %, and the abrasive concentration after polishing stop is 0.1 mass %.

Invention Example 5

A sample is prepared in the same way as in Invention Example 1 except that the above step (c) is omitted and no insulating layer (BOX layer) is formed.

Invention Example 6

A sample is prepared in the same way as in Invention Example 1 except that the total amount of polishing before and after polishing stop is 0.10 μm.

Invention Example 7

A sample is prepared in the same way as in Invention Example 1 except that the total amount of polishing before and after polishing stop is 50 p.m.

In the abovementioned sample preparing procedure, a terrace width and a variation of active layer thickness for each sample are evaluated by the following method.

Terrace Width

The silicon wafer composite after the polishing and before the removal of process damages (after the step (f) but before the step (g)) is visually observed, and thereafter a ring width of such a portion that silicon layer located beneath the oxygen ion implanted layer is exposed in a ring form by removing the oxygen ion implanted layer at an outer peripheral portion of the silicon wafer composite is measured with a ruler as a terrace width. The terrace width is considered to be good when it is not more than 2 mm. Moreover, after the measurement of the terrace width, the silicon wafer composite is put on the rotating platen and polished again.

Variation of Active Layer Thickness

An active layer thickness of each sample as a bonded silicon wafer after the completion of the step of removing the oxygen ion implanted layer (up to the step (h)) is measured by an ellipsometry method to evaluate a variation of active layer thickness based on a difference between a maximum value and a minimum value of the measured values. Moreover, the variation of active layer thickness is considered to be good when it is not more than 60 angstrom.

Figure 6:
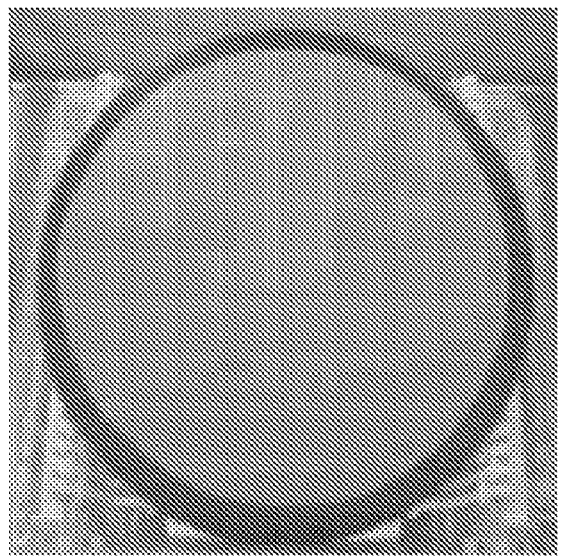
FIG. 6 is a photograph showing a state of a polishing surface in Comparative Example 1 when measuring a terrace width.
Figure 7:
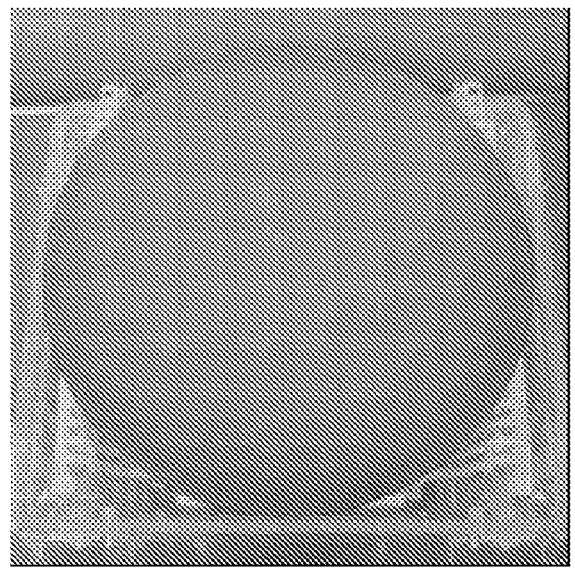
FIG. 7 is a photograph showing a state of a polishing surface in Invention Example 1 when measuring a terrace width.

The evaluation results are shown in Table 1. Also, FIG. 6 shows a state of a polishing surface in Comparative Example 1 when measuring the terrace width, and FIG. 7 shows a state of a polishing surface in Invention Example 1 when measuring the terrace width.

TABLE 1

| Sample name | Kind of bonded silicon wafer | Polishing stop method | Polishing conditions before polishing stop | | | Polishing conditions after polishing stop |
|---|---|---|---|---|---|---|
| | | | Revolution number of rotating platen (RPM) | Polishing means | | Revolution number of rotating platen (RPM) |
| | | | | Kind of polishing solution | Abrasive concentration (mass %) | |
| Invention Example 1 | SOI | Detection based on rotating torque | 31 | Abrasives included | 0.5 | 31 |
| Comparative Example 1 | SOI | Calculation based on polishing rate | 31 | Abrasives included | 0.5 | 31 |
| Invention Example 2 | SOI | Detection based on rotating torque | 31 | Abrasives included | 0.5 | 51 |
| Invention Example 3 | SOI | Detection based on rotating torque | 31 | Abrasives not included | 0.5 | 31 |
| Invention Example 4 | SOI | Detection based on rotating torque | 31 | Abrasives included | 0.5 | 31 |
| Invention Example 5 | DSB | Detection based on rotating torque | 31 | Abrasives included | 0.5 | 31 |
| Invention Example 6 | SOI | Detection based on rotating torque | 31 | Abrasives included | 0.5 | 31 |
| Invention Example 7 | SOI | Detection based on rotating torque | 31 | Abrasives included | 0.5 | 31 |

| Sample name | Polishing conditions after polishing stop Polishing means | | Polishing amount*1 (μm) | Terrace width (mm) | Variation of active layer thickness*2 (Å) |
|---|---|---|---|---|---|
| | Kind of polishing solution | Abrasive concentration (mass %) | | | |
| Invention Example 1 | Abrasives included | 0.5 | 1 | 2.0 | Not more than 60 |
| Comparative Example 1 | Abrasives included | 0.5 | 1 | 20.0 | 375 |
| Invention Example 2 | Abrasives included | 0.5 | 1 | 2.0 | Not more than 60 |
| Invention Example 3 | Abrasives not included | 0.5 | 1 | 2.0 | Not more than 60 |
| Invention Example 4 | Abrasives included | 0.1 | 1 | 2.0 | Not more than 60 |
| Invention Example 5 | Abrasives included | 0.5 | 1 | 2.0 | Not more than 60 |
| Invention Example 6 | Abrasives included | 0.5 | 0.1 | 2.0 | Not more than 60 |
| Invention Example 7 | Abrasives included | 0.5 | 50 | 2.0 | Not more than 60 |

*1Total amount of polishing before and after polishing stop
*2The variation of active layer thickness is not counted in evaluation in the width of 5 mm from the outer peripheral edge of the silicon wafer composite in Invention Examples 1 to 7, and in the width of 25 mm from the outer peripheral edge of the silicon wafer composite in Comparative Example 1

As seen from Table 1, it is confirmed that the terrace width is as good as 2 mm and the variation of active layer thickness is as good as not more than 60 angstrom in all of Invention Examples.

On the other hand, in Comparative Example 1, it is confirmed that the terrace width is as large as 20 mm, which is clearly of over-etching and the variation of active layer thickness is as much as 375 angstrom.

According to the invention, the oxygen ion implanted layer is formed in the silicon wafer for active layer and thereafter the silicon wafer for active layer is bonded to the silicon wafer for support layer to form the silicon wafer composite and then a silicon portion of the silicon wafer composite at a side of the silicon wafer for active layer is polished on the rotating platen having a polishing means, and the polishing is stopped at a time of detecting the change of physical properties on the rotating platen based on the fact that at least a part of the oxygen ion implanted layer is exposed, whereby the bonded silicon wafer having a small variation in the thickness of the active layer can be obtained without breaking the polishing for judging the timing of polishing stop, and the over-etching of the oxygen ion implanted layer in the silicon wafer for active layer can be prevented.

According to the invention, the polishing stop can be conducted by detecting the change of friction resistance produced between the polishing means and the polishing surface of the silicon wafer composite on the rotating platen.

According to the invention, the friction resistance produced between the polishing means and the polishing surface of the silicon wafer composite can be measured by a rotation torque applied to the rotating platen.

What is claimed is:

1. A method of producing a bonded silicon wafer comprising:
   a step of implanting oxygen ions from one surface of a silicon wafer for active layer to form an oxygen ion implanted layer at a given depth area from the one surface of the silicon wafer for active layer;
   a step of bonding the one surface of the silicon wafer for active layer to one surface of a silicon wafer for support layer with or without an insulating layer and then conducting a heat treatment for strengthening the bonding to form a silicon wafer composite;
   a step of polishing a silicon portion at a side of the silicon wafer for active layer in the silicon wafer composite on a rotating platen having a polishing means and stopping the polishing at a time of detecting change of physical properties on the rotating platen resulting from the exposure of at least a part of the oxygen ion implanted layer; and
   a step of removing the oxygen ion implanted layer, wherein the change of physical properties is a change of friction resistance produced between the polishing means and a polished surface of the silicon wafer composite, wherein the friction resistance is measured by a rotation torque applied to the rotating platen, and wherein the silicon wafer composite is polished by making rotation number of the rotating platen different before and after the polishing stop.

2. The method according to claim 1, wherein the polishing means comprises a polishing cloth substantially containing no abrasives and a polishing solution containing abrasives.

3. The method according to claim 1, wherein the polishing means comprises a polishing cloth fixed with given abrasives and a polishing solution substantially containing no abrasives.

4. The method according to claim 2, wherein the polishing solution is a solution containing abrasives and has a different abrasive concentration before and after the polishing stop for polishing the silicon wafer composite.

5. The method according to claim 1, wherein an amount of the silicon wafer composite polished is 0.1 to 50 μm in total before and after the polishing stop.

6. The method according to claim 2 or 3, wherein the polishing cloth is a urethane or a urethane-containing nonwoven cloth, and the polishing solution is a caustic solution.

7. The method according to claim 1, wherein the bonded silicon wafer is composed of a silicon single crystal or of a silicon single crystal and a silicon oxide.

8. The method according to claim 1, wherein the oxygen ion implanted layer contains $SiO_2$ and functions as a polishing stop layer due to difference in physical properties between silicon and $SiO_2$.

* * * * *